United States Patent
Mei et al.

(10) Patent No.: US 12,289,997 B2
(45) Date of Patent: Apr. 29, 2025

(54) HEAT-UTILIZING POWER GENERATION MODULE AND THERMAL POWER GENERATION DEVICE EQUIPPED WITH SAME

(71) Applicants: Sanoh Industrial Co., Ltd., Tokyo (JP); TOKYO INSTITUTE OF TECHNOLOGY, Tokyo (JP)

(72) Inventors: Biao Mei, Koga (JP); Naoya Goto, Koga (JP); Masaki Takeuchi, Koga (JP); Sachiko Matsushita, Tokyo (JP)

(73) Assignees: Sanoh Industrial Co., Ltd., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 17/621,082

(22) PCT Filed: Jun. 17, 2020

(86) PCT No.: PCT/JP2020/023796
§ 371 (c)(1),
(2) Date: Dec. 20, 2021

(87) PCT Pub. No.: WO2020/265216
PCT Pub. Date: Dec. 30, 2020

(65) Prior Publication Data
US 2022/0359805 A1    Nov. 10, 2022

(30) Foreign Application Priority Data
Jun. 26, 2019   (JP) .................................. 2019-119037

(51) Int. Cl.
*H10N 10/17*   (2023.01)
*H10N 10/854*   (2023.01)

(52) U.S. Cl.
CPC ........... *H10N 10/17* (2023.02); *H10N 10/854* (2023.02)

(58) Field of Classification Search
CPC ..... H01L 35/32; H01M 10/0562; H01G 9/21; H10N 10/17; H10N 10/854
See application file for complete search history.

(56) References Cited

U.S. PATENT DOCUMENTS

2010/0258155 A1    10/2010 Lee et al.
2018/0366631 A1*   12/2018 Chikagawa ............ H10N 10/17
(Continued)

FOREIGN PATENT DOCUMENTS

| JP | 2002-042863 A | 2/2002 |
| JP | 2005-251417 A | 9/2005 |

(Continued)

OTHER PUBLICATIONS

Machine translation of JP2005251417A, Nakazawa et al. (Year: 2005).*

(Continued)

*Primary Examiner* — Mayla Gonzalez Ramos
(74) *Attorney, Agent, or Firm* — PROCOPIO, CORY, HARGREAVES & SAVITCH LLP

(57) ABSTRACT

The thermoelectric module includes a first thermoelectric element including a first thermoelectric conversion layer and a first electrolyte layer stacked each other along a stacked direction, a second thermoelectric element stacking the first thermoelectric element in the stacked direction and including a second thermoelectric conversion layer and a second electrolyte layer stacked each other along the stacked direction, a first current collector located on a side of one edge in the stacked direction, a second current collector located on a side of another edge in the stacked direction, and an electron transmission layer located between the first ther- (Continued)

moelectric element and the second thermoelectric element in the stacked direction.

11 Claims, 8 Drawing Sheets

(56) References Cited

U.S. PATENT DOCUMENTS

| | | | |
|---|---|---|---|
| 2019/0356030 A1 | 11/2019 | Venkatasubramanian et al. | |
| 2020/0014006 A1* | 1/2020 | Oliveira | H01M 50/222 |

FOREIGN PATENT DOCUMENTS

| | | |
|---|---|---|
| JP | 2007-018909 A | 1/2007 |
| JP | 2010-135619 A | 6/2010 |
| JP | 2010-251692 A | 11/2010 |
| JP | 2017-152632 A | 8/2017 |
| JP | 2020-108315 A | 7/2020 |
| WO | WO-2012140856 A1 * 10/2012 | H01M 14/00 |
| WO | 2013/161926 A1 | 10/2013 |
| WO | 2015/087388 A1 | 6/2015 |
| WO | WO-2017038988 A1 * 3/2017 | H01L 35/32 |
| WO | 2018/158018 A1 | 9/2018 |

OTHER PUBLICATIONS

Machine translation of WO2017/038988, Matsushita et al. retrieved from https://worldwide.espacenet.com/publicationDetails/biblio?CC=JP&NR=WO2017038988A1&KC=A1&FT=D&ND=3&date=20180621&DB=&locale=en_EP. (Year: 2017).*

Patent Cooperation Treaty, International Preliminary Report on Patentability, Application No. PCT/JP20201023796, dated Jan. 6, 2022, in 8 pages.

1 European Patent Office, Extended European Search Report, EP 20 83 0584, dated Jun. 9, 2023, in 7 pages.

Inukai, Junji, "Surface Science for Secondary Batteries and Capacitors", Surface Science vol. 34, No. 6, pp. 286-289, 2013, in 6 pages.

* cited by examiner (a)

(b)

HEAT-UTILIZING POWER GENERATION MODULE AND THERMAL POWER GENERATION DEVICE EQUIPPED WITH SAME

CROSS-REFERENCE TO RELATED APPLICATIONS

This application is US National Stage of International Patent Application PCT/JP2020/023796, filed Jun. 17, 2020, which claims benefit of priority from Japanese Patent Application JP2019-119037, filed Jun. 26, 2019, the contents of both of which are incorporated herein by reference.

TECHNICAL FIELD

The present disclosure relates to a thermoelectric module and a thermoelectric device including the same.

BACKGROUND ART

As a heat-utilizing power generation using geothermal heat, exhaust heat of a factory, or the like, a method using the Seebeck effect can be included. In addition, as a heat-utilizing power generation that does not use the Seebeck effect, a heat-utilizing power generating element disclosed in Patent Literature 1 below can be included. Patent Literature 1 below discloses that thermal energy is converted into electrical energy by combining an electrolyte and a thermoelectric conversion material that generates a thermal excitation electron and a hole. By using such a heat-utilizing power generating element as a power source for an electronic component, stable power can be supplied to the electronic component, for example, even under a high-temperature environment (for example, 50° C. or more) where a general cell easily deteriorates.

CITATION LIST

Patent Literature

[Patent Literature 1] International Publication No. WO 2017/038988

SUMMARY OF INVENTION

Technical Problem

The above-described power generation device using heat can be used under various conditions and applications. Therefore, it is desired to realize a thermoelectric device capable of exhibiting performance according to needs (e.g., high electromotive force, high output current, and the like).

An object of one aspect of the present disclosure is to provide a thermoelectric module and a thermoelectric device including the same capable of exhibiting performance according to needs.

Solution to Problem

A thermoelectric module according to an aspect of the present disclosure includes a first thermoelectric element including a first thermoelectric conversion layer and a first electrolyte layer stacked each other along a stacked direction, a second thermoelectric element including a second thermoelectric conversion layer and a second electrolyte layer stacked each other along the stacked direction, a first current collector located on a side of one edge in the stacked direction, and an electron transmission layer located between the first thermoelectric element and the second thermoelectric element in the stacked direction. The first thermoelectric element and the second thermoelectric element are located between the first current collector and the second current collector.

The thermoelectric module includes a first thermoelectric element and a second thermoelectric element located between a first current collector and a second current collector in a stacked direction and stacked each other. For example, the electromotive force of the thermoelectric module can be improved by connecting the first thermoelectric element and the second thermoelectric element in series. Alternatively, for example, by connecting the first thermoelectric element and the second thermoelectric element in parallel, the output current of the thermoelectric module can be increased. As described above, the thermoelectric module includes the thermoelectric elements, and the connection mode of each thermoelectric element is appropriately adjusted, whereby it is possible to provide a thermoelectric module capable of exhibiting performance according to needs.

In the thermoelectric module, the first thermoelectric element and the second thermoelectric element may be connected in series to each other via an electron transmission layer. In this case, the first thermoelectric element and the second thermoelectric element are separated from each other via the electron transmission layer. As a result, the electrons in the thermoelectric module easily flow only in a desired direction, so that the electromotive force of the thermoelectric module can be favorably improved.

The first thermoelectric conversion layer may include an electron thermal excitation layer and an electron transport layer stacked in a stacked direction, the electron thermal excitation layer may be located between the electron transport layer and the first electrolyte layer, the electron transmission layer may be in contact with the electron transport layer and the second electrolyte layer, and a work function or a band gap of the electron transmission layer may be larger than a band gap of the electron transport layer. In this case, the oxidation reaction of the electrolyte at the interface between the electron transmission layer and the second electrolyte layer can be prevented. Accordingly, the electrons in the second electrolyte layer easily flow only in a desired direction.

The second electrolyte layer may be an organic electrolyte layer or an inorganic electrolyte layer including a metal ion, and the electron transmission layer may contain a metal, graphite, a conductive oxide, or an electron conductive polymer material having a lower ionization tendency than the metal ion in the second electrolyte layer. In this case, even when an organic electrolyte layer or an inorganic electrolyte layer is used, electrons in the second electrolyte layer easily flow only in a desired direction.

In the above case, the electron transmission layer may include at least one of platinum, gold, silver, and an aluminum alloy as the metal having a lower ionization tendency than the metal ion in the second electrolyte layer, and may contain at least one of indium tin oxide and fluorine-doped tin oxide as the conductive oxide.

A thermoelectric module according to another aspect of the present disclosure includes a first thermoelectric element including a first thermoelectric conversion layer and a first electrolyte layer stacked each other along a stacked direction, a second thermoelectric element including a second thermoelectric conversion layer and a second electrolyte layer stacked each other along the stacked direction, a first current collector located on a side of one edge in the stacked direction, and a first insulating material located between the first thermoelectric element and the second thermoelectric element in the stacked direction. The first thermoelectric element and the second thermoelectric element are located between the first current collector and the second current collector, and are connected in parallel to each other. This thermoelectric module can provide a thermoelectric module capable of exhibiting performance according to needs by appropriately adjusting the connection mode of each thermoelectric element. The insulating material is located between the first thermoelectric element and the second thermoelectric element, and the first thermoelectric element and the second thermoelectric element are connected in parallel to each other. Therefore, it is possible to increase the output current of the thermoelectric module while miniaturizing the thermoelectric module as viewed from the stacked direction.

The thermoelectric module may further include a third current collector located between the insulating material and the first thermoelectric element in the stacked direction, and a fourth current collector located between the insulating material and the second thermoelectric element in the stacked direction, wherein the first current collector and the third current collector are electrically connected to each other, and the second current collector and the fourth current collector are electrically connected to each other.

The thermoelectric module may further include a third thermoelectric element located between the insulating material and the second thermoelectric element in the stacked direction and including a third thermoelectric conversion layer and a third electrolyte layer stacked each other along the stacked direction, and an electron transmission layer located between the second thermoelectric element and the third thermoelectric element in the stacked direction, wherein the second thermoelectric element and the third thermoelectric element are connected in series to each other through the electron transmission layer. In this case, it is possible to improve the electromotive force of the thermoelectric module and increase the current output from the thermoelectric module.

The first thermoelectric conversion layer may include an electron thermal excitation layer and an electron transport layer stacked in a stacked direction, the electron thermal excitation layer may be located between the electron transport layer and the first electrolyte layer, the electron transmission layer may be in contact with the electron transport layer and the third electrolyte layer, and a work function or a band gap of the electron transmission layer may be larger than a band gap of the electron transport layer. In this case, the oxidation reaction of the electrolyte at the interface between the electron transmission layer and the third electrolyte layer can be prevented. Accordingly, the electrons in the third electrolyte layer easily flow only in a desired direction.

A thermoelectric device according to another aspect of the present disclosure includes the thermoelectric modules, in each of the thermoelectric modules, the first thermoelectric element and the second thermoelectric element are connected in series to each other, and the thermoelectric modules are arranged in a direction intersecting the stacked direction, are connected in parallel to each other, and are integrated with each other. In this case, it is possible to realize a thermoelectric device in which both an increase in electromotive force and an increase in output current are achieved. Therefore, for example, by adjusting the number of thermoelectric modules included in the thermoelectric device, it is possible to provide a thermoelectric device capable of exhibiting performance according to needs.

A thermoelectric device according to still another aspect of the present disclosure includes the thermoelectric modules, in each of the thermoelectric modules, the first thermoelectric element and the second thermoelectric element are connected in series to each other, and the thermoelectric modules are arranged in a direction intersecting the stacked direction, are connected in series to each other, and are integrated with each other. In this case, a thermoelectric device capable of further improving the electromotive force can be realized. Therefore, for example, by adjusting the number of thermoelectric modules included in the thermoelectric device, it is possible to provide a thermoelectric device capable of exhibiting performance according to needs.

The thermoelectric device may further include an insulating material provided between adjacent thermoelectric modules. In this case, a short circuit between adjacent thermoelectric modules can be favorably suppressed.

Advantageous Effects of Invention

According to an aspect of the present disclosure, it is possible to provide a thermoelectric module and a thermoelectric device including the same capable of exhibiting performance according to needs.

Figure 2:
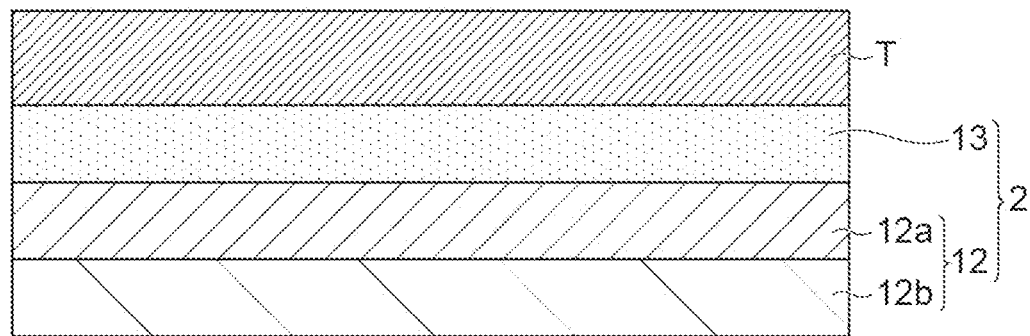
Figure 2:
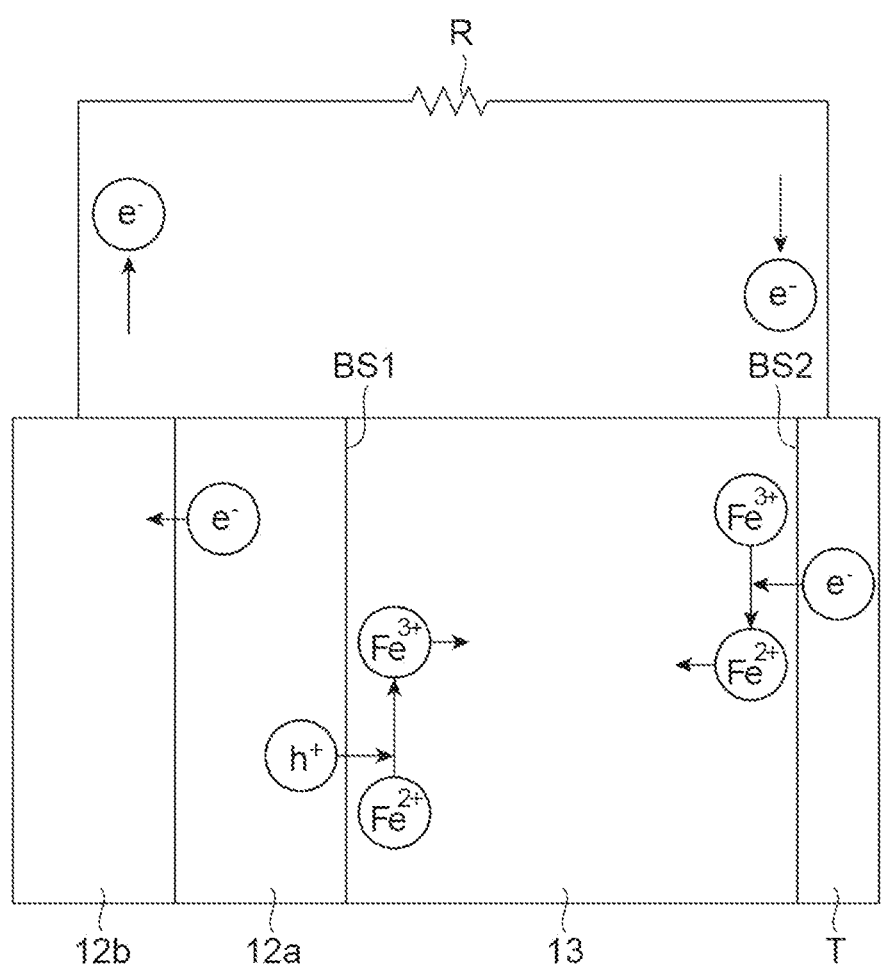

(a) of FIG. 2 is a schematic cross-sectional view showing a single thermoelectric element and a terminal, and (b) of FIG. 2 is a schematic view for explaining a power generation mechanism of the thermoelectric element.

Figure 3:
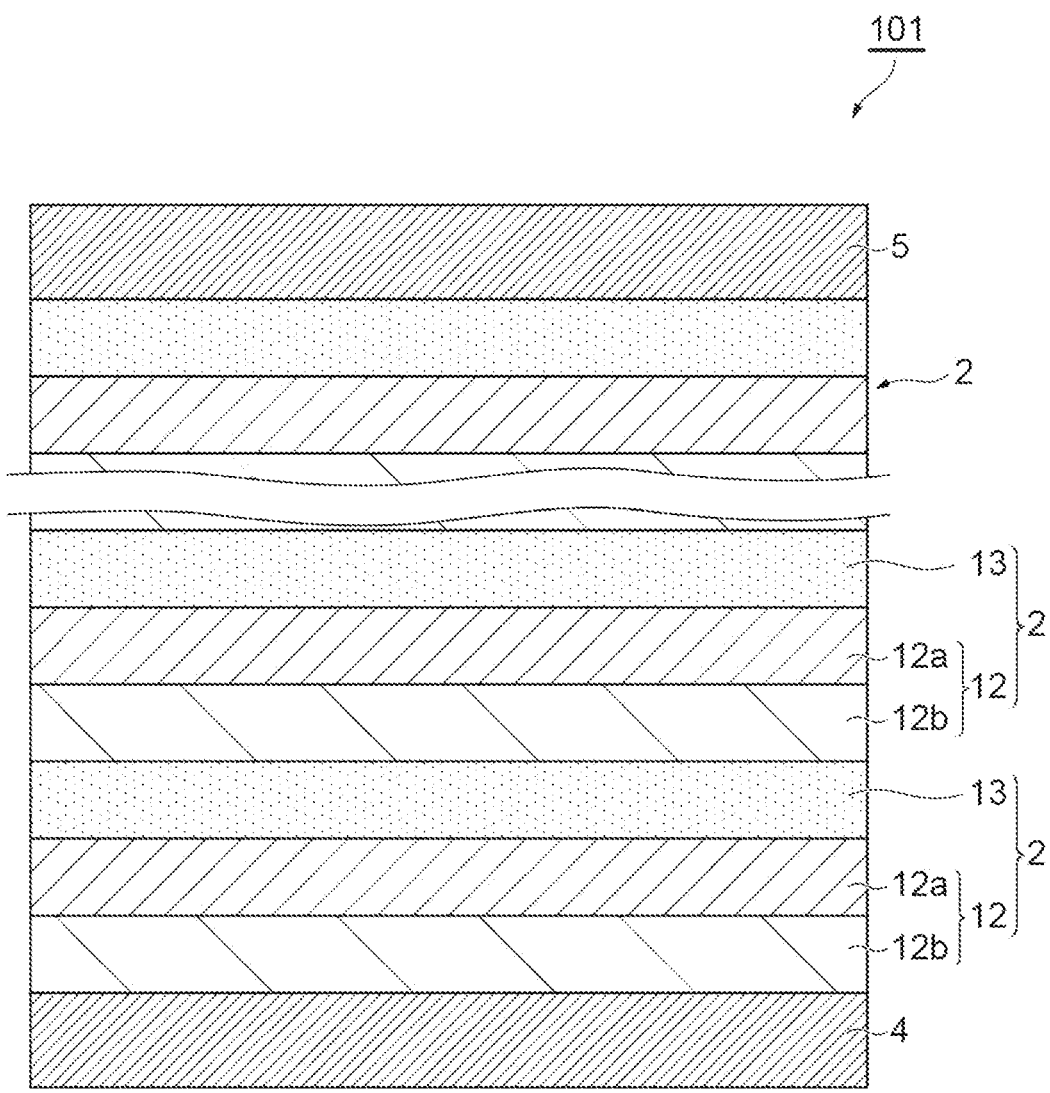

FIG. 3 is a schematic cross-sectional view showing a thermoelectric module according to a comparative example.

Figure 4:
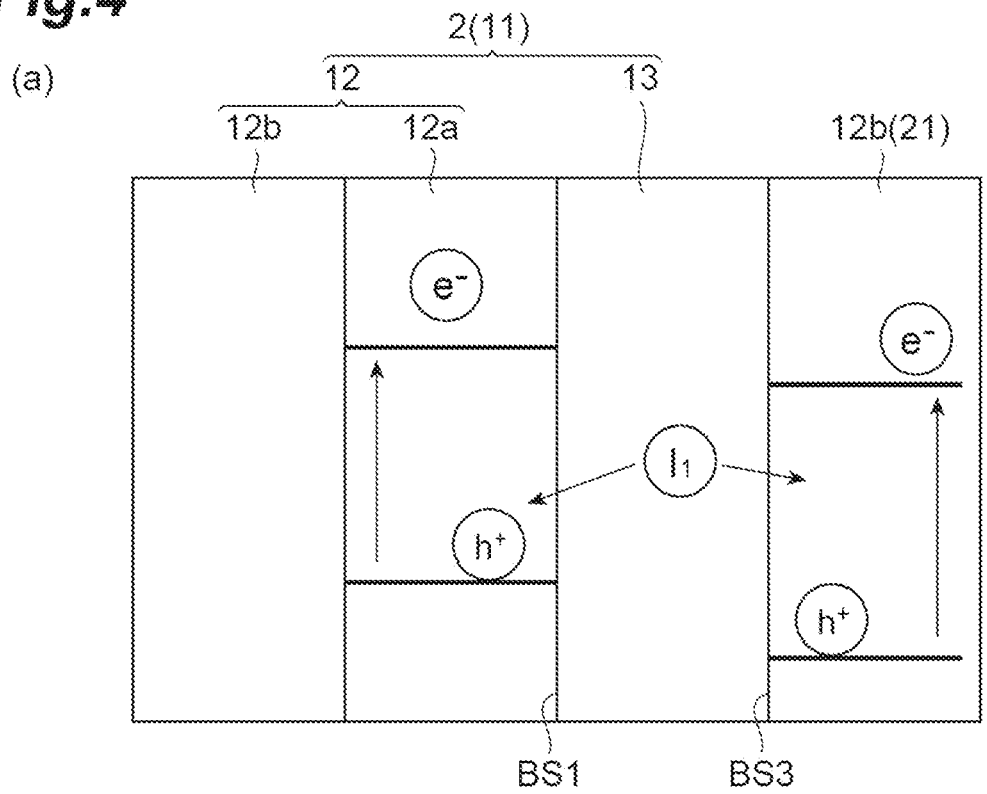
Figure 4:
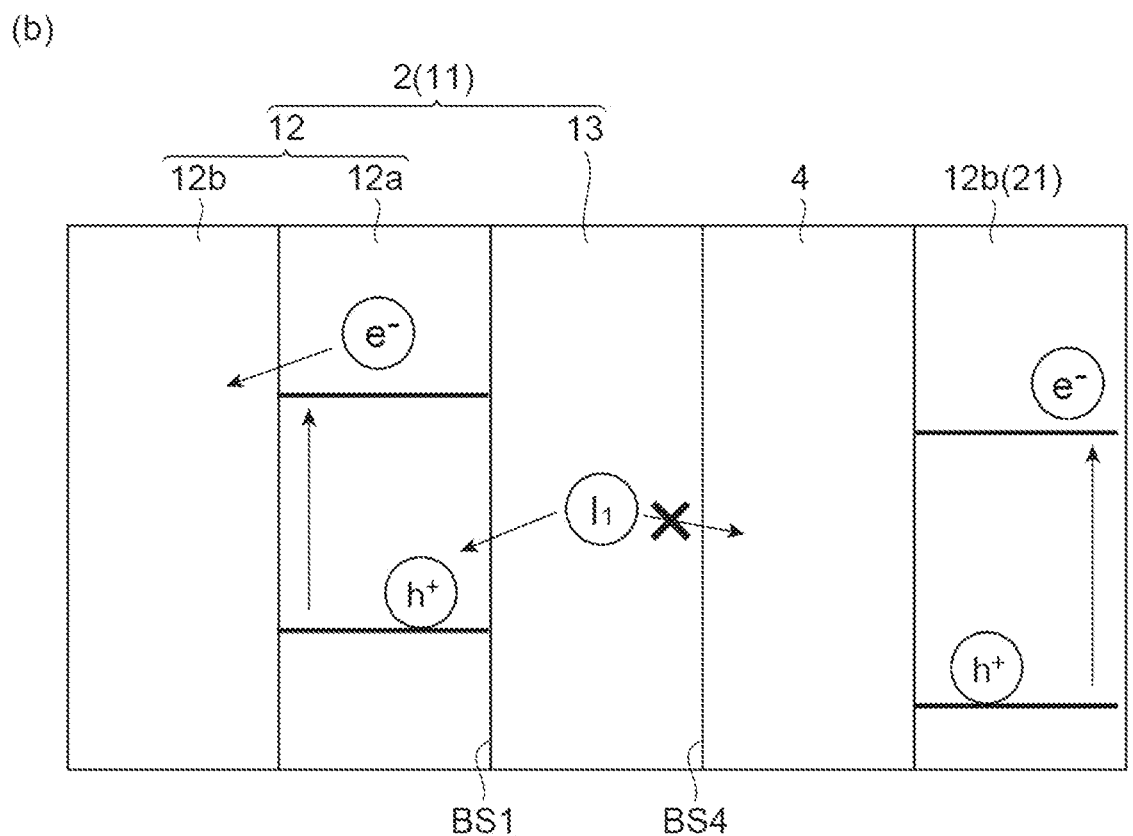

(a) of FIG. 4 is a diagram schematically illustrating movement of electrons in a thermoelectric module according to a comparative example, and (b) of FIG. 4 is a diagram schematically illustrating movement of electrons in a thermoelectric module according to a first embodiment.

Figure 5:
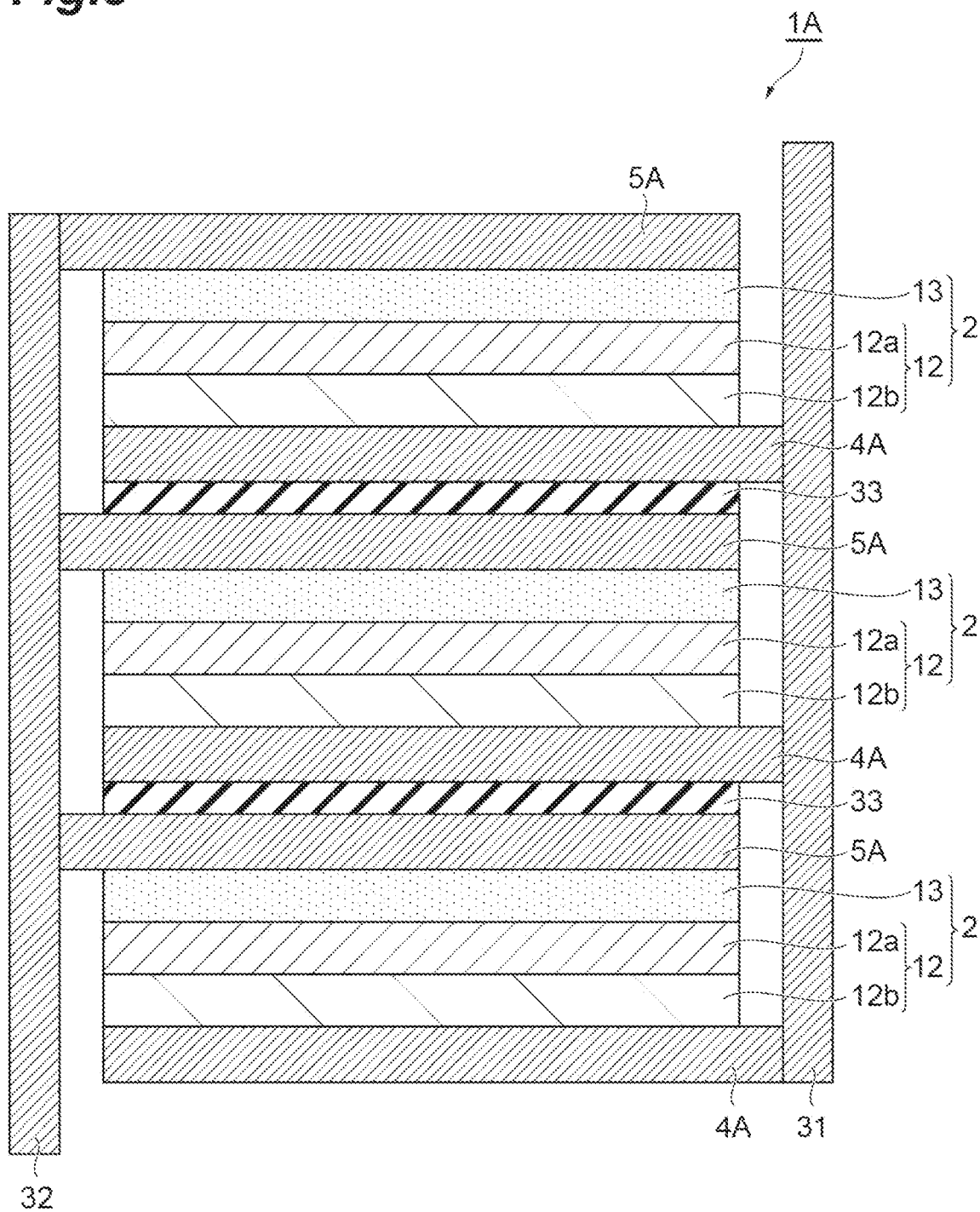

FIG. 5 is a schematic cross-sectional view illustrating a thermoelectric module according to a second embodiment.

Figure 6:
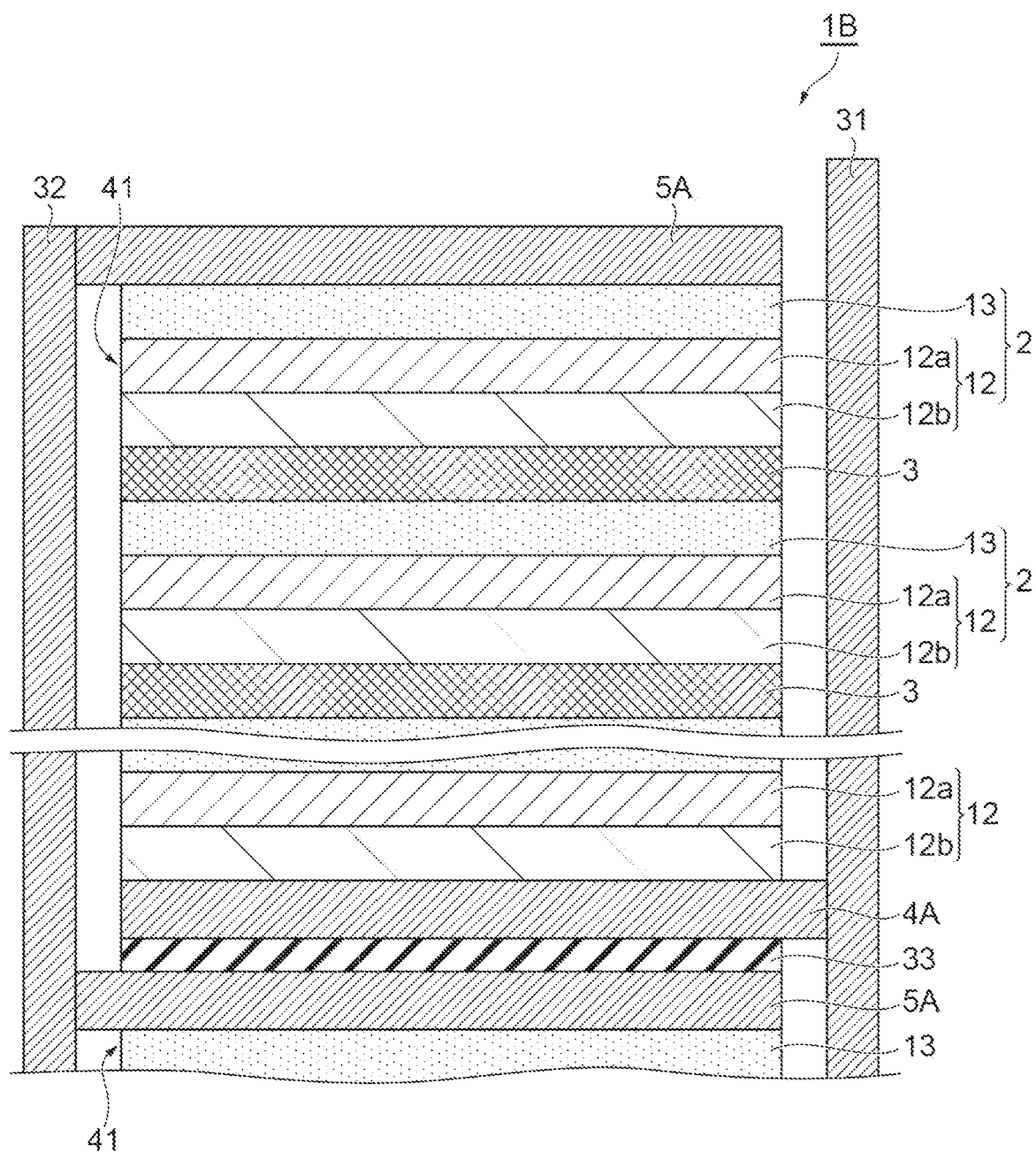

FIG. 6 is a schematic cross-sectional view showing a thermoelectric module according to a modification of the second embodiment.

Figure 7:
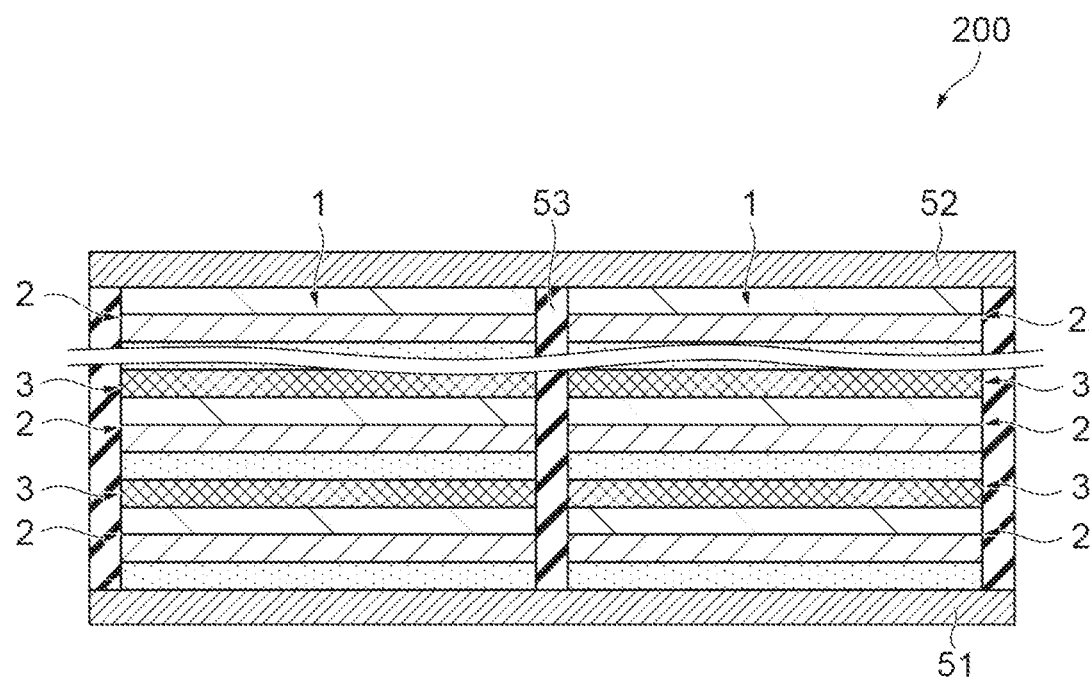

FIG. 7 is a schematic cross-sectional view showing an example of a thermoelectric device.

Figure 8:
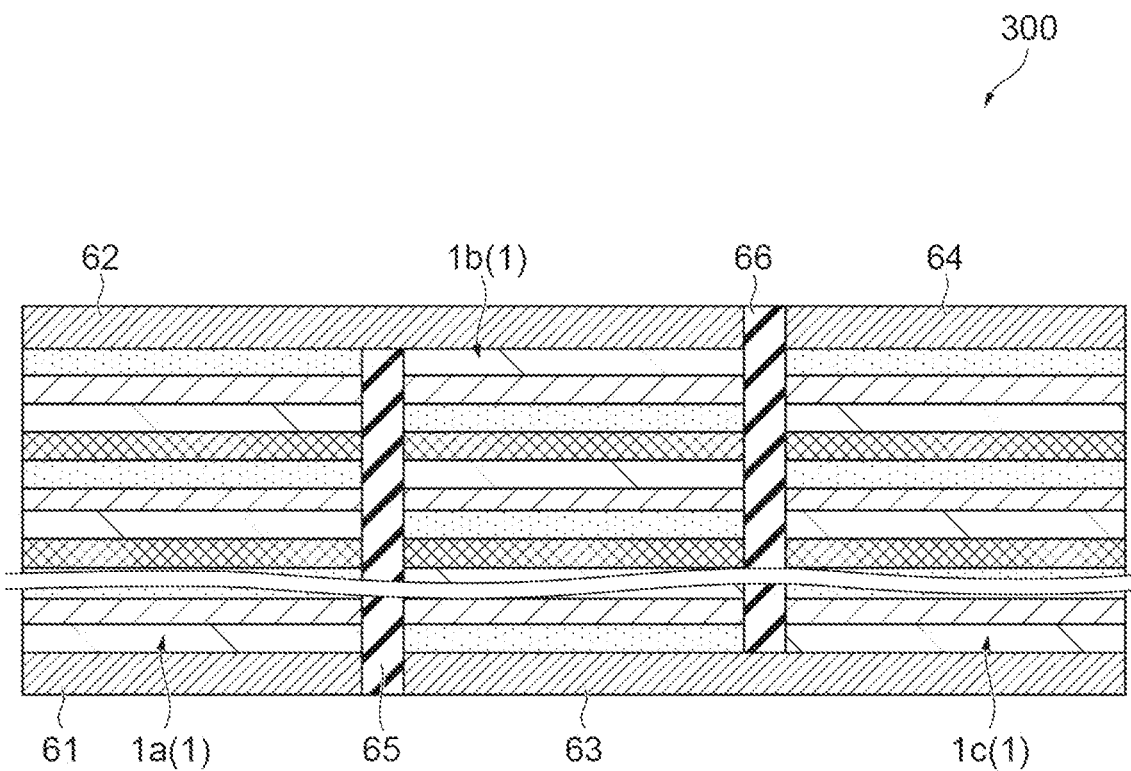

FIG. 8 is a schematic cross-sectional view showing another example of the thermoelectric device.

DESCRIPTION OF EMBODIMENTS

Hereinafter, embodiments of the present disclosure will be described in detail with reference to the accompanying drawings. In the following explanation, the same reference numerals will be used for the same elements or elements having the same function, and duplicate explanation will be omitted.

First Embodiment

Figure 1:
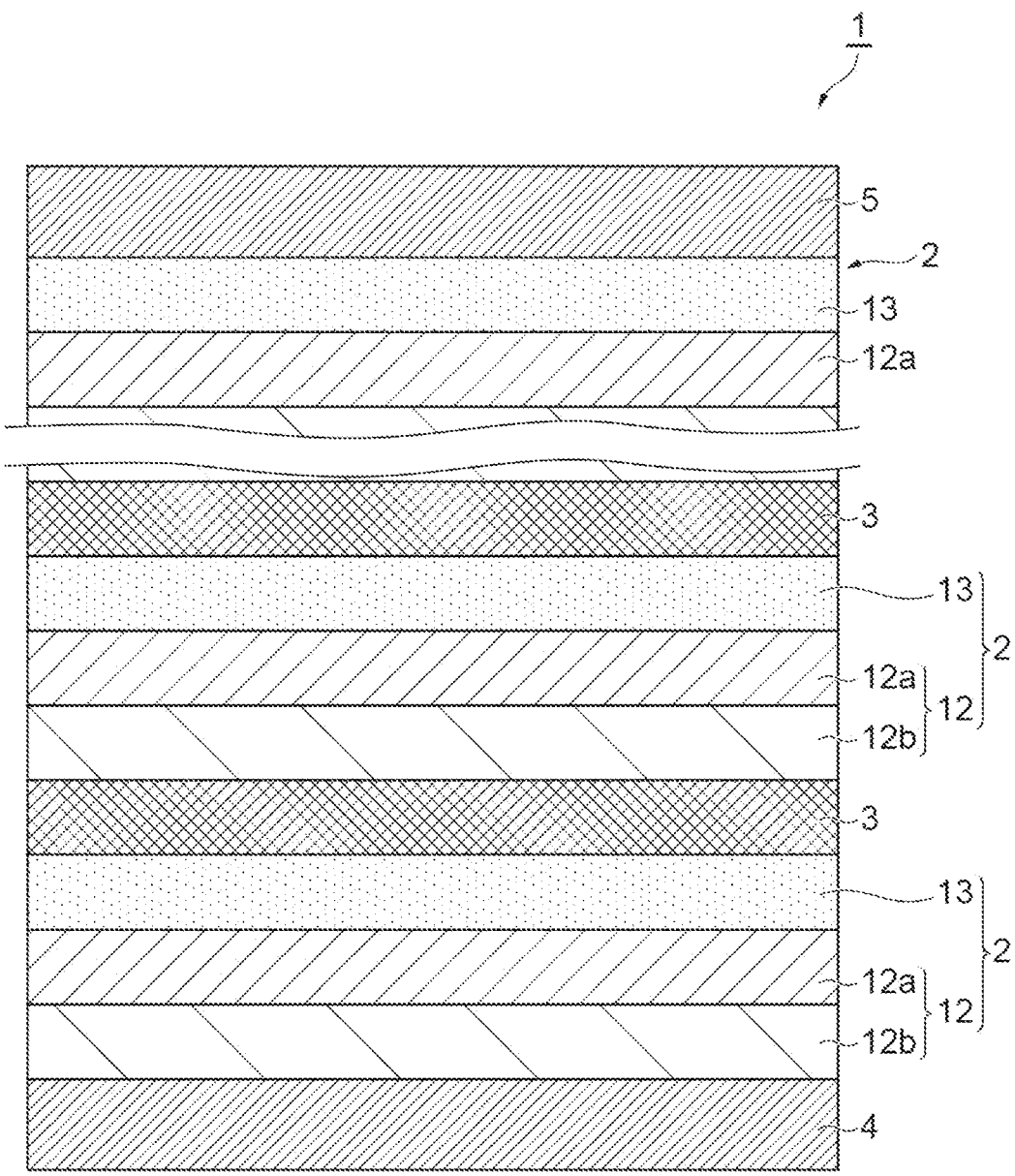
FIG. 1 is a schematic cross-sectional view illustrating a thermoelectric module according to a first embodiment.

First, the configuration of the thermoelectric module according to the first embodiment will be described with reference to FIG. 1. FIG. 1 is a schematic cross-sectional view illustrating a thermoelectric module according to a first embodiment. The thermoelectric module 1 shown in FIG. 1 is an aggregate of members (i.e., thermoelectric generators for converting thermal energy into electrical energy) that exhibit a function of generating power by being supplied with heat from the outside. The thermoelectric module 1 includes a plurality of thermoelectric elements 2, a plurality of electron transmission layers 3, and a pair of current collectors 4, 5. The shape of the thermoelectric module 1 is not particularly limited. The shape of the thermoelectric module 1 in a plan view may be, for example, a polygonal shape such as a rectangular shape, a circular shape, or an elliptical shape.

The plurality of thermoelectric elements 2, the plurality of electron transmission layers 3, and the pair of current collectors 4, 5 are stacked each other along a predetermined direction. The plurality of thermoelectric elements 2 and the plurality of electron transmission layers 3 are located between the pair of current collectors 4, 5. Hereinafter, the predetermined direction is simply referred to as a "stacked direction." In addition, "identical" in the present specification is a concept including not only "completely identical" but also "substantially identical."

Each of the thermoelectric elements 2 is a thermoelectric generator having the same shape, and generates thermally excited electrons and holes by being supplied with heat from the outside. The generation of thermally excited electrons and holes by the thermoelectric element 2 is performed at, for example, 25° C. or higher and 300° C. or lower. From the viewpoint of generating a sufficient number of thermally excited electrons and holes, the thermoelectric element 2 may be heated to, for example, 50° C. or higher during use of the thermoelectric module 1. From the viewpoint of satisfactorily preventing deterioration or the like of the thermoelectric element 2, the thermoelectric element 2 may be heated to, for example, 200° C. or lower during use of the thermoelectric module 1. The temperature at which a sufficient number of thermally excited electrons are generated is, for example, "a temperature at which the thermally excited electron density in the thermoelectric element 2 is $10^{15}/cm^3$ or more."

In the first embodiment, the thermoelectric elements 2 are stacked each other along the stacked direction, and are connected to each other in series. The number of the thermoelectric elements 2 varies depending on the performance required for the thermoelectric module 1.

The thermoelectric element 2 is a stacked body including a thermoelectric conversion layer 12 and an electrolyte layer 13 stacked each other in the stacked direction. The thermoelectric conversion layer 12 includes an electron thermal excitation layer 12a and an electron transport layer 12b stacked each other in the stacked direction. In the first embodiment, the stacking order of the electron thermal excitation layer 12a, the electron transport layer 12b, and the electrolyte layer 13 in each thermoelectric element 12 is aligned.

The electron thermal excitation layer 12a is a layer for generating thermally excited electrons and holes in the thermoelectric element 2, and is in contact with the electrolyte layer 13. The electron thermal excitation layer 12a includes a thermoelectric conversion material. The thermoelectric conversion material is a material in which excited electrons increase under a high-temperature environment, and is, for example, a semiconductor material such as a metal semiconductor (Si, Ge), a tellurium compound semiconductor, a silicon germanium (Si—Ge) compound semiconductor, a silicide compound semiconductor, a skutterudite compound semiconductor, a clathrate compound semiconductor, a Heusler compound semiconductor, a half-Heusler compound semiconductor, a metal oxide semiconductor, or an organic semiconductor. From the viewpoint of generating sufficient thermally excited electrons at a relatively low temperature, the thermoelectric conversion material may be germanium (Ge).

The electron thermal excitation layer 12a may include a plurality of thermoelectric conversion materials. The electron thermal excitation layer 12a may include a material other than the thermoelectric conversion material. For example, the electron thermal excitation layer 12a may include a binder for binding the thermoelectric conversion material, a sintering aid for assisting in forming the thermoelectric conversion material, and the like. The electron thermal excitation layer 12a is formed by, for example, a squeegee method, a screen printing method, a discharge plasma sintering method, a compression molding method, a sputtering method, a vacuum deposition method, a chemical vapor deposition method (CVD method), a spin coating method, or the like.

The electron transport layer 12b transports the thermally excited electrons generated in the electron thermal excitation layer 12a to the outside thereof. The electron transport layer 12b is located opposite to the electrolyte layer 13 with the electron thermal excitation layer 12a interposed therebetween in the stacked direction. Therefore, in the thermoelectric element 2, the electron transport layer 12b, the electron thermal excitation layer 12a, and the electrolyte layer 13 are stacked in order and in the stacked direction. The electron transport layer 12b includes an electron transport material. The electron transport material is a material whose conduction band potential is equal to or more positive than that of the thermoelectric conversion material. The difference between the conduction band potential of the electron transport material and the conduction band potential of the thermoelectric conversion material is, for example, 0.01V or more and 0.1V or less. The electron transport material is, for example, a semiconductor material, an electron transport organic substance, or the like. The electron transport layer 12b is formed by, for example, a squeegee method, a screen printing method, a discharge plasma sintering method, a compression molding method, a sputtering method, a vacuum deposition method, a CVD method, a spin coating method, or the like.

The semiconductor material used for the electron transport material is, for example, the same as the semiconductor material included in the electron thermal excitation layer 12a. Examples of the electron transporting organic substance include an N-type conductive polymer, an N-type low molecular weight organic semiconductor, and a π-electron conjugated compound. The electron transport layer 12b may include a plurality of electron transport materials. The electron transport layer 12b may include a material other than the electron transport material. For example, the electron transport layer 12b may include a binder for binding the electron transport material, a sintering aid for assisting in forming the electron transport material, and the like. From the viewpoint of electron transportability, the semiconductor material may be n-type Si. The electron transport layer 12b including n-type Si is formed, for example, by doping a silicon layer with phosphorus or the like.

The electrolyte layer 13 is a layer including an electrolyte in which charge transport ion pairs can move at a temperature at which a sufficient number of thermally excited electrons are generated in the thermoelectric element 2. The charge transport ion pair moves in the electrolyte layer 13, whereby a current flows in the electrolyte layer 13. The "charge transport ion pair" is a stable pair of ions with different valences, such as a metal ion. When one ion is oxidized or reduced, it becomes the other ion and can move electron and hole. The redox potential of the charge transport ion pair in the electrolyte layer 13 is more negative than the valence band potential of the thermoelectric conversion material included in the electron thermal excitation layer 12a. Therefore, at the interface between the electron thermal excitation layer 12a and the electrolyte layer 13, the easily oxidizable ion of the charge transport ion pair is oxidized to become the other ion. The electrolyte layer 13 may include ions other than charge transport ion pairs. The electrolyte layer 13 can be formed by, for example, a squeegee method, a screen printing method, a sputtering method, a vacuum deposition method, a CVD method, a sol-gel method, or a spin coating method.

The electrolyte included in the electrolyte layer 13 is not particularly limited. The electrolyte may be, for example, a liquid electrolyte, a solid electrolyte, or a gel electrolyte. In the first embodiment, the electrolyte layer 13 includes a solid electrolyte. The solid electrolyte is, for example, a substance that is physically and chemically stable at the above-described temperature, and may include polyvalent ions. Examples of the solid electrolyte include a sodium ion conductor, a copper ion conductor, an iron ion conductor, a lithium ion conductor, a silver ion conductor, a hydrogen ion conductor, a strontium ion conductor, an aluminum ion conductor, a fluorine ion conductor, a chlorine ion conductor, an oxide ion conductor and the like. The solid electrolyte may be, for example, polyethylene glycol (PEG) having a molecular weight of 600,000 or less or a derivative thereof. When the solid electrolyte is PEG, a polyvalent ion source such as copper ions or iron ions may be included in the electrolyte layer 13. Alkali metal ions may be included in the electrolyte layer 13 from the viewpoint of life improvement and the like. The molecular weight of PEG corresponds to the weight average molecular weight thereof measured by gel permeation chromatography in terms of polystyrene. The electrolyte layer 13 may be a hole transport semiconductor.

The electrolyte layer 13 may be an organic electrolyte layer or an inorganic electrolyte layer. Whether the electrolyte layer 13 is an organic electrolyte layer or an inorganic electrolyte layer is determined according to, for example, the composition of the electron transmission layer 3. The organic electrolyte layer is, for example, an electrolyte layer mainly composed of 1 or more organic substances. The organic substance includes at least one of a low molecular weight organic compound and a high molecular weight organic compound. The inorganic electrolyte layer is, for example, an electrolyte layer mainly composed of 1 or more inorganic substances. The inorganic substance may be a simple substance or an inorganic compound. The organic electrolyte layer may include an inorganic substance, and the inorganic electrolyte layer may include an organic substance. Each of the organic material and the inorganic material may be an electrolyte or may be different from the electrolyte. For example, the electrolyte layer 13 may include an organic material or an inorganic material that functions as a binder for binding the electrolyte, a sintering aid for assisting in forming the electrolyte, and the like. The organic substance is, for example, PEDOT/PSS, N-methylpyrrolidone (NMP), acetonitrile, or the like, and the inorganic substance is, for example, silicon dioxide ($SiO_2$), titanium dioxide ($TiO_2$), aluminum oxide ($AlO_x$), or the like. An organic compound having a molecular weight of 10,000 or more is defined as a polymer organic compound.

The electron transmission layer 3 is a layer for conducting electrons moving in the thermoelectric module 1 only in a predetermined direction. In the first embodiment, the electron transmission layer 3 is a layer that exhibits electronic conductivity and does not exhibit ionic conductivity. Therefore, the electron transmission layer 3 can also be referred to as an ion conduction prevention layer. The electron transmission layer 3 is located between adjacent thermoelectric elements 2 in the stacked direction. Therefore, a couple of thermoelectric elements 2 adjacent to each other in the stacked direction are connected in series to each other via the electron transmission layer 3. In the first embodiment, the electron transmission layer 3 is in contact with each of the electrolyte layer 13 of one thermoelectric element 2 and the electron transport layer 12b of the other thermoelectric element 2.

The electron transmission layer 3 is formed by, for example, a squeegee method, a screen printing method, a discharge plasma sintering method, a compression molding method, a sputtering method, a vacuum deposition method, a CVD method, a spin coating method, a plating method, or the like. For example, when the electrolyte layer 13 is an organic electrolyte layer, the electron transmission layer 3 located between the adjacent thermoelectric elements 2 is provided on the surface of the electron transport layer 12b included in one thermoelectric element 12 (the surface opposite to the surface on which the electron thermal excitation layer 12a is provided). For example, when the electrolyte layer 13 is an inorganic electrolyte layer, the electron transmission layer 3 is provided on the surface of the electrolyte layer 13 included in the thermoelectric element 2. The thickness of the electron transmission layer 3 is, for example, 0.1 μm or more and 100 μm or less.

In the first embodiment, the work function (or band gap) of the electron transmission layer 3 is larger than the band gap of the electron transport layer 12b. The difference between the work function or band gap of the electron transmission layer 3 and the band gap of the electron transport layer 12b is, for example, 0.1 eV or more. The valence band potential of the electron transmission layer 3 may be more positive than the reduction potential of ions in the electrolyte layer 13 included in the electrolyte layer 13. In this case, the oxidation reaction of the ions hardly occurs at the interface between the electron transmission layer 3 and the electrolyte layer 13. For example, when the electrolyte layer is an organic electrolyte layer, the electron transmission layer 3 includes a conductive oxide such as ITO (indium tin oxide) and FTO (fluorine-doped tin oxide), an electron conductive polymer material, or the like. For example, when the electrolyte layer is an inorganic electrolyte layer, the electron transmission layer 3 contains Pt (platinum), Au (gold), Ag (silver), an aluminum alloy (for example, duralumin or an Si—Al alloy), an electron conductive polymer material, or the like. The electronically conductive polymer material is for example PEDOT/PSS. The conduction band potential of the electron transmission layer 3 may be more negative than the conduction band potential of the electron transport layer 12b. In this case, electrons easily move from the electron transport layer 12b to the electron transmission layer 3. When the electrolyte layer 13 includes a metal ion, the electron transmission layer 3 may include a metal having a lower ionization tendency than the metal ion, graphite, a conductive oxide, or an electron conductive polymer material. Examples of such metals, conductive oxides, and electronically conductive polymer materials are described above.

The current collector 4 is an electrode that functions as one of a positive electrode and a negative electrode in the thermoelectric module 1, and is located at one end of the thermoelectric module 1 in the stacked direction. The current collector 5 is an electrode that functions as the other of the positive electrode and the negative electrode in the thermoelectric module 1, and is located at the other end of the thermoelectric module 1 in the stacked direction. Each of the current collectors 4, 5 is a conductive plate having, for example, a single-layer structure or a laminated structure. The conductive plate is, for example, a metal plate, an alloy plate, or a composite plate thereof. At least one of the current collectors 4, 5 may exhibit high thermal conductivity from the viewpoint of satisfactorily exhibiting the performance of the thermoelectric module 1. Since no temperature difference is required in the thermoelectric module 1, it is desirable that both current collectors 4, 5 exhibit high thermal conductivity. For example, the thermal conductivity of at least one of the current collectors 4, 5 may be 10 W/m·K or more.

Next, referring to FIG. 2, the outline of the power generation mechanism of the thermoelectric element will be described. (a) of FIG. 2 is a schematic cross-sectional view showing a single thermoelectric element and a terminal, and (b) of FIG. 2 is a schematic view for explaining a power generation mechanism of the thermoelectric element. For the sake of explanation, the charge transport ion pair included in the electrolyte layer 13 shown in (a) and (b) of FIG. 2 is referred to as iron ion ($Fe^{2+}$ and $Fe^{3+}$). As shown in (b) of FIG. 2, when the electron thermal excitation layer 12a absorbs heat in a high-temperature environment, an electron $e^-$ excited in the electron thermal excitation layer 12a is generated. The electron $e^-$ move to the electron transport layer 12b. As a result, a hole $h^+$ is generated in the electron thermal excitation layer 12a. The hole $h^+$ oxidize $Fe^{2+}$ at the first interface BS1 between the electron thermal excitation layer 12a and the electrolyte layer 13. That is, the hole $h^+$ robs the $Fe^{2+}$ electron at the first interface BS1. As a result, $Fe^{2+}$ located at the first interface BS1 becomes Fe'. On the other hand, the excess electrons $e^-$ in the electron transport layer 12b move to the outside, pass through a resistor R and a terminal T, and reach the electrolyte layer 13. The electron $e^-$ that has reached the electrolyte layer 13 reduces $Fe^{2+}$ at a second interface BS2 between the electrolyte layer 13 and the terminal T. As a result, $Fe^{2+}$ located at the second interface BS2 becomes Fe'. Then, $Fe^{2+}$ oxidized at the first interface BS1 is diffused toward the second interface BS2, and $Fe^{2+}$ reduced at the second interface BS2 is diffused toward the first interface BS1. Thus, the oxidation-reduction reaction between the first interface BS1 and the second interface BS2 is maintained. The thermoelectric element 2 generates power by generating electrons due to such thermal excitation and generating the oxidation-reduction reaction. The work that occurs when electrons pass through the resistor R corresponds to power generation.

Next, the operation and effect of the thermoelectric module 1 according to the first embodiment described above will be described with reference to the following comparative example. FIG. 3 is a schematic cross-sectional view showing a thermoelectric module according to a comparative example. The thermoelectric module 101 shown in FIG. 3 is different from the thermoelectric module 1 according to the first embodiment in that it does not include an electron transmission layer. Therefore, in the thermoelectric module 101, the thermoelectric elements 2 are in contact with each other and connected in series to each other. Therefore, in the adjacent thermoelectric elements 2, the electron transport layer 12b included in one thermoelectric element 2 and the electrolyte layer 13 included in the other thermoelectric element 2 are in contact with each other.

(a) of FIG. 4 is a diagram schematically illustrating movement of electrons in a thermoelectric module according to a comparative example, and (b) of FIG. 4 is a diagram schematically illustrating movement of electrons in a thermoelectric module according to a first embodiment. For explanation, in (a) and (b) of FIG. 4, one of the adjacent thermoelectric elements 2 is referred to as a first thermoelectric element 11, and the other is referred to as a second thermoelectric element 21. It is assumed that the electron thermal excitation layer 12a includes a first semiconductor, the electron transport layer 12b includes a second semiconductor, and the electrolyte layer 13 Includes a charge-transporting ion pair ($I_1$, $I_2$). In addition, the redox potential of the charge-transporting ion pair included in the electrolyte layer 13 is located within the band gap of the first semiconductor and is more negative than the valence band potential of the first semiconductor. Furthermore, the valence band potential of the second semiconductor is more positive than the valence band potential of the first semiconductor. That is, the redox potential of the charge-transporting ion pair is more negative than the valence band potential of the second semiconductor. The valence of ion $I_1$ is greater than the valence of ion $I_2$.

As shown in (a) of FIG. 4, the electrolyte layer 13 of the first thermoelectric element 11 is in contact with both the electron thermal excitation layer 12a included in the first thermoelectric element 11 and the electron transport layer 12b included in the second thermoelectric element 21. As described above, in the first thermoelectric element 11, the ion $I_1$ diffuses to the first interface BS1 in the electrolyte layer 13. Although not shown, the ion $I_2$ diffuses to the third interface BS3 between the electron transport layer 12b of the second thermoelectric element 21 and the electrolyte layer 13 of the first thermoelectric element 11. This causes electron $e^-$ to move from the second thermoelectric element 21 to the first thermoelectric element 11. That is, the electron $e^-$ moves along one side of the stacked direction in the thermoelectric module 101.

Since the electron transport layer 12b includes the second semiconductor, excited electrons $e^-$ can be generated also in the electron transport layer 12b. When the electrons $e^-$ move to the electrolyte layer 13, holes $h^+$ may also be generated in the electron transport layer 12b. As described above, the valence band potential of the second semiconductor is more positive than the valence band potential of the first semiconductor, and the redox potential of the charge-transporting ion pair is more negative than the valence band potential of the second semiconductor. Therefore, the holes $h^+$ generated in the electron transport layer 12b oxidize the ion $h^+$ included in the electrolyte layer 13 at the third interface BS3. Therefore, an oxidation reaction occurs at both ends of the electrolyte layer 13 in the stacked direction. In this case, the ion $I_1$ spreads not only to a side of the first interface BS1 but also to a side of the third interface BS3. Accordingly, in the electrolyte layer 13, electrons $e^-$ may move not only from the second thermoelectric element 21 to the first thermoelectric element 11, but also from the first thermoelectric element 11 to the second thermoelectric element 21. That is, when the thermoelectric elements 2 are simply stacked, electron $e^-$ in the electrolyte layer 13 may move to both sides of the stacked direction in the thermoelectric module 101. In such a case, the potential difference between adjacent thermoelectric elements 2 is unlikely to increase. Therefore, in the comparative example, even when the thermoelectric elements 2 are used, it is difficult to improve the electromotive force of the thermoelectric module 101. Therefore, the output of the thermoelectric module 101 may be lower than the theoretical value.

In contrast, in the thermoelectric module 1 according to the first embodiment, as shown in (b) of FIG. 4, the electron transmission layer 3 is located between the adjacent thermoelectric elements 2. By providing such an electron transmission layer 3, the electrolyte layer 13 of one thermoelectric element 2 and the electron transport layer 12$b$ of the other thermoelectric element 2 are separated from each other. In this case, even if holes h$^+$ are generated in the electron transport layer 12$b$, the holes h$^+$ cannot rob electrons from ion h$^+$ included in the electrolyte layer 13. Therefore, the oxidation reaction of ion I$_1$ can be generated only at the first interface BS1. Therefore, the ion h$^+$ included in the electrolyte layer 13 is less likely to diffuse toward the fourth interface BS4 between the electrolyte layer 13 and the electron transmission layer 3. That is, the ion I$_1$ is likely to diffuse only to a side of the first interface BS1 in the electrolyte layer 13. As a result, electrons e$^-$ in the thermoelectric module 1 easily flow only in a desired direction. Therefore, in the thermoelectric module 1, since the potential difference between the adjacent thermoelectric elements 2 is likely to spread, the electromotive force of the thermoelectric module 1 can be favorably improved. In addition, by adjusting the number of thermoelectric elements 2 included in the thermoelectric module 1, the electromotive force of the thermoelectric module 1 can be set to a value suitable for needs.

In the first embodiment, the thermoelectric conversion layer 12 includes an electron thermal excitation layer 12$a$ and an electron transport layer 12$b$ stacked in the stacked direction, the electron thermal excitation layer 12$a$ is located between the electron transport layer 12$b$ included in one thermoelectric element 12 and the electrolyte layer 2 included in the other thermoelectric element 13, the electron transmission layer 3 is in contact with the electron transport layer 12$b$ and the electrolyte layer 13, and the work function or band gap of the electron transmission layer 3 may be larger than the band gap of the electron transport layer 12$b$. In this case, the oxidation reaction of the electrolyte (ion I$_1$) at the fourth interface BS4 between the electron transmission layer 3 and the electrolyte layer 13 can be prevented. Accordingly, the electrons e$^-$ in the electrolyte layer 13 easily flow only in a desired direction.

In the first embodiment, the electrolyte layer 13 is an organic or inorganic electrolyte layer including metal ions, and the electron transmission layer 3 may include a metal, graphite, conductive oxides, or electronically conductive polymer materials having a lower ionization tendency than a metal ion in the electrolyte layer 13. In this case, even when an organic electrolyte layer or an inorganic electrolyte layer is used as the electrolyte layer 13, the electrons e$^-$ in the electrolyte layer 13 easily flow only in a desired direction.

In the first embodiment, the electron transmission layer 3 may include at least one of platinum, gold, silver, and an aluminum alloy as metals having lower ionization tendencies than a metal ion in the electrolyte layer 13, and may include at least one of indium tin oxide and fluorine-doped tin oxide as conductive oxides.

Second Embodiment

Hereinafter, a thermoelectric module according to a second embodiment will be described. In the description of the second embodiment, description overlapping with the first embodiment will be omitted, and portions different from the first embodiment will be described. That is, the description of the first embodiment may be appropriately applied to the second embodiment within a technically possible range.

FIG. 5 is a schematic cross-sectional view illustrating a thermoelectric module according to a second embodiment. As shown in FIG. 5, the thermoelectric module 1A includes a plurality of thermoelectric elements 2, a plurality of current collectors 4A and 5A, an outer electrode 31, 32, and a plurality of insulating materials 33, which are stacked in a stacked direction.

Each thermoelectric element 2 is located between current collectors 4A and 5A in the stacked direction. That is, each thermoelectric element 2 is interposed between current collectors 4A and 5A in the stacked direction. In the thermoelectric module 1A, an insulating material 33 is provided between the thermoelectric elements 2. In detail, the insulating material 33 is provided between the current collectors 4A and 5A adjacent to each other in the stacked direction. Therefore, the current collector 5A, the insulating material 33, and the current collector 4A are stacked in order between a couple of adjacent thermoelectric elements 2 along the stacked direction. In other words, the current collector 5A is located between the insulating material 33 and one thermoelectric element 2 in the stacked direction, and the current collector 4A is located between the insulating material 33 and the other thermoelectric element 2 in the stacked direction. The current collector 4A, the thermoelectric element 2, and the current collector 5A are stacked in order between the insulating materials 33 adjacent to each other in the stacked direction.

The current collector 4A is a conductor that functions as one of the positive electrode and the negative electrode of the thermoelectric element 2, and has a substantially plate shape. The current collector 5A is a conductor that functions as the other of the positive electrode and the negative electrode of the thermoelectric element 2, and has a substantially plate shape. The current collectors 4A and 5A are made of, for example, the same material as the current collector 4, 5 of the first embodiment. A portion of the current collectors 4A, 5A protrudes from each thermoelectric element 2 along a direction intersecting the stacked direction (e.g., horizontal direction). In order to prevent contact of the outer electrodes 31 and 32, a portion of the current collector 4A and a portion of the current collector 5A may protrude in opposite directions.

The outer electrode 31 is a conductor that functions as one of a positive electrode and a negative electrode of the thermoelectric module 1A, and is electrically connected to each current collector 4A. The outer electrode 32 is a conductor that functions as the other of the positive electrode and the negative electrode of the thermoelectric module 1A, and is electrically connected to each current collector 5A. Therefore, in the thermoelectric module 1A, the thermoelectric elements 2 are connected in parallel to each other. At least one of the outer electrodes 31, 32 and may exhibit high thermal conductivity from the viewpoint of favorably exhibiting the performance of the thermoelectric module 1A. For example, the thermal conductivity of at least one of the outer electrodes 31, 32 and may be 10 W/m·K or more. Since the outer electrode 31, 32 is spaced apart from the thermoelectric element 2, the outer electrode 31, 32 may include copper or the like. Since no temperature difference is required in the thermoelectric module 1A, it is desirable that both of the outer electrodes 31, 32 and exhibit high thermal conductivity.

The insulating material 33 is an insulator that prevents a short circuit between the thermoelectric elements 2 adjacent to each other in the stacked direction, and has a substantially plate shape. In the horizontal direction, the edges of the insulating material 33 may or may not be aligned with the edges of the thermoelectric element 2. From the viewpoint of satisfactorily performing the function of the insulating material 33, the edge of the insulating material 33 may be positioned outside the edge of the thermoelectric element 2 in the horizontal direction. In this case, at least a part of the edge of the insulating material 33 may be located outside the edge of the thermoelectric element 2. The insulating material 33 includes, for example, an organic insulator or an inorganic insulator exhibiting heat resistance. The organic insulator is, for example, a heat-resistant plastic. The inorganic insulator is, for example, ceramics such as alumina. The insulating material 33 may exhibit high thermal conductivity from the viewpoint of favorably exhibiting the performance of each thermoelectric module 1. For example, the thermal conductivity of the insulating material 33 may be 10 W/m·K or more. Alternatively, the insulating material 33 may include a member, particles, or the like exhibiting high thermal conductivity. The member may exhibit electrical conductivity. In this case, the component is completely covered by the insulating material. The insulating material 33 is formed by, for example, coating, vapor deposition, powder coating, extrusion coating, cold spraying, or the like.

From the viewpoint of favorably exhibiting the performance of the thermoelectric module 1A, the insulating material 33 may exhibit high thermal conductivity. For example, the thermal conductivity of the insulating material 33 may be 10 W/m·K or more. Alternatively, the insulating material 33 may include a thermally conductive member exhibiting high thermal conductivity. The thermally conductive member may exhibit electrical conductivity. In this case, the component is completely covered by the insulator. The insulating material 33 is formed by, for example, coating, vapor deposition, powder coating, extrusion coating, cold spraying, or the like.

In the thermoelectric module 1A according to the second embodiment described above, the thermoelectric elements 2 are stacked in the stacked direction and connected in parallel to each other. Therefore, the output current of the thermoelectric module 1A can be increased while suppressing the area of the thermoelectric module 1A viewed from the stacked direction.

In the second embodiment, the thermoelectric module 1A includes a current collector 5A located between the insulating material 33 and one thermoelectric element 2 in the stacked direction and a current collector 4A located between the insulating material 33 and the other thermoelectric element 2 in the stacked direction, each current collector 4A is electrically connected to each other, and each current collector 5A is electrically connected to each other. In this case, a short circuit between the thermoelectric elements 2 can be favorably suppressed.

FIG. 6 is a schematic cross-sectional view showing a thermoelectric module according to a modification of the second embodiment. The thermoelectric module 1B shown in FIG. 6 is a combination of the thermoelectric module 1 shown in the first embodiment and the thermoelectric module 1A shown in the second embodiment. To be more specific, between the pair of current collectors 4A and 5A in the thermoelectric module 1B, the plurality of thermoelectric elements 2 are stacked in the stacked direction and connected in series to each other. In the thermoelectric elements 2, an electron transmission layer 3 is located between adjacent thermoelectric elements 2.

When the thermoelectric element 2 and the electron transmission layer 3 interposed between the pair of current collectors 4A and 5A are defined as aggregation 41, the thermoelectric module 1B includes a plurality of aggregations 41. From the viewpoint of stabilizing the electromotive forces of the thermoelectric modules 1B, it is desirable that the numbers of the thermoelectric elements 2 and the electron transmission layers 3 included in each aggregation 41 match each other.

In the thermoelectric module 1B according to such the modification, both the effects of the first and second embodiments are achieved. For example, by adjusting the number of thermoelectric elements 2 included in each aggregation 41, the electromotive force of the thermoelectric module 1B can be set to a value suitable for the needs. Alternatively, by adjusting the number of aggregations 41, the output current of the thermoelectric module 1B can be set to a value suitable for the needs.

Third Embodiment

Hereinafter, a thermoelectric device including a thermoelectric module according to a third embodiment will be described. In the description of the third embodiment, description overlapping with the first embodiment and the second embodiment will be omitted, and portions different from the first embodiment and the second embodiment will be described. That is, the descriptions of the first embodiment and the second embodiment may be appropriately used for the third embodiment within a technically possible range.

FIG. 7 is a schematic cross-sectional view showing an example of a thermoelectric device. A thermoelectric device 200 shown in FIG. 7 includes a plurality of thermoelectric modules 1 according to the first embodiment. In the thermoelectric device 200, the thermoelectric modules 1 are connected in parallel to each other and arranged in a direction (e.g., horizontal direction) intersecting the stacked direction. In addition, the thermoelectric modules 1 are integrated with each other. In this example, the pair of current collectors included in each thermoelectric module 1 is shared. Specifically, the thermoelectric device 200 includes a pair of current collectors 51, 52 that sandwich the thermoelectric element 2 and the electron transmission layer 3 included in each thermoelectric module 1 in the stacked direction. In addition, the thermoelectric device 200 includes an insulating material 53 interposed between the pair of current collectors 51, 52 in the stacked direction.

The current collector 51 is an electrode that functions as one of a positive electrode and a negative electrode of the thermoelectric device 200, and is located at one end of each thermoelectric module 1 in the stacked direction. That is, the current collector 51 functions as one of a positive electrode and a negative electrode for each thermoelectric module 1. The current collector 52 is an electrode that functions as the other of the positive electrode and the negative electrode of the thermoelectric device 200, and is located at the other end of each thermoelectric module 1 in the stacked direction. That is, the current collector 52 functions as the other of the positive electrode and the negative electrode for each thermoelectric module 1. Each of the current collectors 51, 52 is made of, for example, the same material as the current collector 4, 5 of the first embodiment. In FIG. 7, each of the current collectors 51, 52 has a single plate shape, but is not limited thereto. For example, each of the current collectors 51, 52 and may be a composite of an electrode provided in each thermoelectric module and a wiring or a conductive plate electrically connecting these electrodes.

The insulating material 53 is an insulator located between adjacent thermoelectric modules 1 when viewed from the stacked direction. The insulating material 53 is also an insulator located between adjacent thermoelectric elements 2 in a direction intersecting the stacked direction. The insulating material 53 is made of, for example, the same material as the insulating material 33 shown in the second embodiment. From the viewpoint of protecting the thermoelectric device 200, the insulating material 53 surrounds the thermoelectric module 1 when viewed from the stacked direction. From the viewpoint of preventing contact between adjacent thermoelectric modules 1, it is desirable that the insulating material 53 be in contact with both of the current collectors 51, 52 and without a gap.

In such a thermoelectric device 200, the electromotive force of the thermoelectric device 200 can be set to a value suitable for needs by adjusting the number of thermoelectric elements 2 included in each thermoelectric module 1. In addition, by adjusting the number of thermoelectric modules 1, the output current of the thermoelectric device 200 can be set to a value that meets the needs. Therefore, it is possible to provide the thermoelectric device 200 capable of exhibiting performance meeting needs.

The thermoelectric device 200 includes an insulating material 53 provided between adjacent thermoelectric modules 1. Therefore, a short circuit between adjacent thermoelectric modules 1 can be favorably suppressed.

FIG. 8 is a schematic cross-sectional view showing another example of the thermoelectric device. As shown in FIG. 8, the thermoelectric device 300 includes a plurality of thermoelectric modules 1 connected in series to each other and arranged in a direction (for example, horizontal direction) intersecting the stacked direction. The plurality of thermoelectric modules 1 are integrated with each other. In the following description, it is assumed that the thermoelectric device 300 includes a first thermoelectric module 1a, a second thermoelectric module 1b, and a third thermoelectric module 1c which are arranged in this order from the left side of FIG. 8. The first thermoelectric module 1a and the second thermoelectric module 1b are adjacent to each other, and the second thermoelectric module 1b and the third thermoelectric module 1c are adjacent to each other. The stacking order of the thermoelectric elements 2 included in the first thermoelectric module 1a is the same as the stacking order of the thermoelectric elements 2 included in the third thermoelectric module 1c. Meanwhile, the stacking order of the thermoelectric elements 2 included in the second thermoelectric module 1b is different from the stacking order of the first thermoelectric module 1a and the third thermoelectric module 1c.

The thermoelectric device 300 includes current collectors 61 to 64. The current collector 61 is a conductor that functions as one of a positive electrode and a negative electrode of the first thermoelectric module 1a, and is located at one end of the thermoelectric device 300 in the stacked direction. The current collector 62 is a conductor functioning as the other of the positive electrode and the negative electrode of the first thermoelectric module 1a and the one of the positive electrode and the negative electrode of the second thermoelectric module 1b, and is located at the other end of the thermoelectric device 300 in the stacked direction. The current collector 63 is a conductor functioning as the other of the positive electrode and the negative electrode of the second thermoelectric module 1b and one of the positive electrode and the negative electrode of the third thermoelectric module 1c, and is located at one end of the thermoelectric device 300 in the stacked direction. The current collector 64 is a conductor that functions as the other of the positive electrode and the negative electrode of the third thermoelectric module 1c, and is located at the other end of the thermoelectric device 300 in the stacked direction. in FIG. 8, each of the current collectors 62, 63 has a single plate shape, but is not limited thereto. For example, the current collector 62 may be a composite of an electrode provided in the first thermoelectric module 1a, an electrode provided in the second thermoelectric module 1b, and a wiring or a conductive plate electrically connecting these electrodes.

The thermoelectric device 300 includes an insulating material 65, 66. The insulating material 65 is an insulator provided between the first thermoelectric module 1a and the second thermoelectric module 1b. In order to prevent a short circuit between the first thermoelectric module 1a and the second thermoelectric module 1b, the insulating material 65 is provided between the current collectors 61, 63. The insulating material 66 is an insulator provided between the second thermoelectric module 1b and the third thermoelectric module 1c. In order to prevent a short circuit between the second thermoelectric module 1b and the third thermoelectric module 1c, the insulating material 66 is provided between the current collectors 62, 64. The insulating material 65, 66 is made of, for example, the same material as the insulating material 33 shown in the second embodiment.

In such a thermoelectric device 300, since the plurality of thermoelectric modules 1 are connected in series to each other, the electromotive force can be further improved. Therefore, it is possible to provide the thermoelectric device 300 capable of exhibiting performance more suitable for needs.

The thermoelectric device 300 includes an insulating material 65, 66 provided between adjacent thermoelectric modules 1. In this case, a short circuit between adjacent thermoelectric modules 1 can be favorably suppressed.

The thermoelectric module and the thermoelectric device including the same according to the present disclosure are not limited to the above-described embodiment, the above-described modification, and the like, and various other modifications are possible. For example, in the first embodiment and the like, a plurality of electron transmission layers are included, but the present invention is not limited thereto. When the thermoelectric module includes a couple of thermoelectric elements, the thermoelectric module may have one electron transmission layers.

In the above-described embodiment and the above-described modification, the thermoelectric element includes the thermoelectric conversion layer and the electron transport layer, but the present invention is not limited thereto. The thermoelectric element may have layers other than the couple of layers described above. The electron transmission layer is in contact with both the electron transport layer and the electrolyte layer. For example, some layer may be provided between the electron transmission layer and the electron transport layer. That is, any layer may be provided between the electron transmission layer and the thermoelectric element.

In the above embodiment and the above modification, each of the thermoelectric module and the thermoelectric device may be covered with a protective material or the like. In this case, damage to the thermoelectric module and the thermoelectric device can be suppressed. The protective material may cover the entire thermoelectric module or a part thereof. For example, the protective material may cover only the side surfaces of the thermoelectric module. In this case, it is desirable that the protective material covers the side surface without a gap. Similarly, the protective material may cover the entire thermoelectric device or a portion thereof. From the viewpoint of thermoelectric generation efficiency, the protective material preferably exhibits high thermal conductivity. The protective material is, for example, a resin containing Si (Si heat transfer resin), ceramics, highly heat conductive glass, or the like. The protective material may include a thermally conductive member exhibiting high thermal conductivity. The thermally conductive member may exhibit electrical conductivity. In this case, the heat conducting member is completely covered by the insulator.

In the second embodiment, the electron transport layer is not limited to a semiconductor material. For example, the electron transport layer may be a metal material. Examples of the metal material include metals, alloys, N-type metal oxides, N-type metal sulfides, alkali metal halides, and alkali metals. N-type metals are, for example, niobium, titanium, zinc, tin, vanadium, indium, tungsten, tantalum, zirconium, molybdenum and manganese.

REFERENCE SIGNS LIST 1, 1A, 1B: thermoelectric module
1a: first thermoelectric module
1b: second thermoelectric module
1c: third thermoelectric module
2: thermoelectric element
3: electron transmission layer
4, 4A, 5, 5A, 51, 52, 61 to 64: current collector
11: first thermoelectric element
12: thermoelectric conversion layer
12a: electron thermal excitation layer
12b: electron transport layer
13: electrolytic layer
21: second thermoelectric element
31, 32: outer electrode
33, 53, 65, 66: insulating material
200, 300: thermoelectric device.

The invention claimed is:

1. A thermoelectric module comprising:
a first thermoelectric element including a first thermoelectric conversion layer and a first electrolyte layer stacked each other along a stacked direction;
a second thermoelectric element stacking the first thermoelectric element in the stacked direction, the second thermoelectric element including a second thermoelectric conversion layer and a second electrolyte layer stacked each other along the stacked direction;
a first current collector located at a side of one edge in the stacked direction;
a second current collector located at a side of another edge in the stacked direction; and
an electron transmission layer located between the first thermoelectric element and the second thermoelectric element in the stacked direction,
wherein the first thermoelectric element and the second thermoelectric element are located between the first current collector and the second current collector in the stacked direction, and
wherein the second electrolyte layer is in direct contact with the electron transmission layer.

2. The thermoelectric module according to claim 1,
wherein the first thermoelectric element and the second thermoelectric element are connected in series to each other through the electron transmission layer.

3. The thermoelectric module according to claim 2,
wherein the first thermoelectric conversion layer includes an electron thermal excitation layer and an electron transport layer stacked in the stacked direction,
wherein the electron thermal excitation layer is located between the electron transport layer and the first electrolyte layer,
wherein the electron transmission layer is in contact with the electron transport layer, and
wherein a work function or a band gap of the electron transmission layer is greater than a band gap of the electron transport layer.

4. The thermoelectric module according to claim 3,
wherein the second electrolyte layer is an organic electrolyte layer or an inorganic electrolyte layer including a metal ion, and
wherein the electron transmission layer comprises a metal, graphite, a conductive oxide, or an electron conducting polymer material having a lower ionization tendency than the metal ion in the second electrolyte layer.

5. The thermoelectric module according to claim 4,
wherein the electron transmission layer includes at least one of platinum, gold, silver, and an aluminum alloy as the metal, or includes at least one of indium tin oxide and fluorine-doped tin oxide as the conductive oxide.

6. A thermoelectric device comprising a plurality of thermoelectric modules, each thermoelectric module having a structure according to claim 1,
wherein, in each of the thermoelectric modules, the first thermoelectric element and the second thermoelectric element are connected in series to each other, and
wherein the thermoelectric modules are arranged in a direction intersecting the stacked direction, are connected in parallel to each other, and are integrated with each other.

7. A thermoelectric device comprising a plurality of thermoelectric modules, each thermoelectric module having a structure according to claim 1,
wherein, in each of the thermoelectric modules, the first thermoelectric element and the second thermoelectric element are connected in series to each other, and
wherein the thermoelectric modules are arranged in a direction intersecting the stacked direction, are connected in series, and integrated with each other.

8. The thermoelectric device according to claim 6, further comprising an insulating material provided between adjacent thermoelectric modules.

9. The thermoelectric device according to claim 7, further comprising an insulating material provided between adjacent thermoelectric modules.

10. The thermoelectric module according to claim 1,
wherein the electron transmission layer is in contact with the first thermoelectric element and the second thermoelectric element.

11. The thermoelectric module according to claim 1,
wherein the first electrolyte layer is a solid electrolyte layer.

* * * * *